US012656430B2

(12) United States Patent  
Grodzki et al.

(10) Patent No.: US 12,656,430 B2  
(45) Date of Patent: Jun. 16, 2026

(54) METHOD FOR OPERATING A LIQUID HELIUM COOLING SYSTEM OF A MAGNETIC RESONANCE IMAGING SYSTEM AND A MAGNETIC RESONANCE IMAGING SYSTEM

(71) Applicant: Siemens Healthineers AG, Forchheim (DE)

(72) Inventors: David Grodzki, Erlangen (DE); Adam Paul Johnstone, Thame (GB); Soeren Gruebel, Erlangen (DE); Rainer Kirsch, Baiersdorf (DE)

(73) Assignee: SIEMENS HEALTHINEERS AG, Forchheim (DE)

( * ) Notice: Subject to any disclaimer, the term of this patent is extended or adjusted under 35 U.S.C. 154(b) by 181 days.

(21) Appl. No.: 18/755,992

(22) Filed: Jun. 27, 2024

(65) Prior Publication Data

US 2025/0004080 A1 Jan. 2, 2025

(30) Foreign Application Priority Data

Jun. 29, 2023 (EP) .................................... 23182279

(51) Int. Cl.
| | |
|---|---|
| *G01R 33/38* | (2006.01) |
| *G01R 33/34* | (2006.01) |
| *G01R 33/36* | (2006.01) |

(52) U.S. Cl.
CPC ... *G01R 33/3804* (2013.01); *G01R 33/34023* (2013.01); *G01R 33/3403* (2013.01); *G01R 33/36* (2013.01)

(58) Field of Classification Search
CPC .......... G01R 33/34023; G01R 33/3403; G01R 33/36; G01R 33/3804
See application file for complete search history.

(56) References Cited

U.S. PATENT DOCUMENTS

| | | | | |
|---|---|---|---|---|
| 10,775,455 B2 * | 9/2020 | Koeber | ................... | H01F 6/006 |
| 2009/0096452 A1 * | 4/2009 | Gore | ..................... | F25B 49/022 |
| | | | | 324/318 |

(Continued)

FOREIGN PATENT DOCUMENTS

| | | |
|---|---|---|
| JP | H1199135 A | 4/1999 |
| JP | 2011061630 A | 3/2011 |

(Continued)

OTHER PUBLICATIONS

Javadi Abbas et al: "Energy Management System for Energyintensive Radiology Appliances", 2023 IEEE International Conference on Environment and Electrical Engineering and 2023 IEEE Industrial and Commercial Power Systems Europe (EEEIC / &CPS Europe), IEEE, Jun. 6, 2023 (Jun. 6, 2023), pp. 1-6, XP034390568, DOI: 10.1109/EEEIC/ICPSEUROPE57605.2023.10194628.

(Continued)

*Primary Examiner* — Gregory H Curran  
(74) *Attorney, Agent, or Firm* — Harness, Dickey & Pierce, P.L.C.

(57) ABSTRACT

A method for operating a liquid helium cooling system of a magnetic resonance imaging system, comprises: providing a first timetable including scan times and a second timetable including a plurality of time slots associated with one of at least two different levels of electrical power availability; determining, based on the first timetable, off-times when the system is not used for scanning; determining, based on the second timetable, at least one time slot within the off-times that is not associated with the level of highest electrical power availability; activating a power-saving mode during the at least one time slot; and activating a standard operating mode of the liquifying device prior to start of the next scan time.

23 Claims, 4 Drawing Sheets

(56) References Cited

U.S. PATENT DOCUMENTS

| | | | |
|---|---|---|---|
| 2011/0271693 A1* | 11/2011 | Jiang | G01R 33/3804 |
| | | | 324/318 |
| 2013/0127467 A1 | 5/2013 | Yokoi et al. | |
| 2013/0181708 A1 | 7/2013 | Biber et al. | |

FOREIGN PATENT DOCUMENTS

| | | | |
|---|---|---|---|
| JP | 2013244616 A | 12/2013 | |
| JP | 2018068775 A | 5/2018 | |

OTHER PUBLICATIONS

Trenbath Kim et al: "Medical Imaging Equipment Energy Efficiency", , Mar. 15, 2023 (Mar. 15, 2023), pp. 1-36, XP093104505, Retrieved from the Internet: URL:https://betterbuildingssolutioncenter. energy.gov/sites/default/files/Medicaf%2etmaging%20Equipm~r1t% 20Energy%20Efflc1enty.päf.

Fenchel ; Wehrl / Magnetic Resonance Imaging Systems as Energy Storage / Jun. 29, 2022.

* cited by examiner

METHOD FOR OPERATING A LIQUID HELIUM COOLING SYSTEM OF A MAGNETIC RESONANCE IMAGING SYSTEM AND A MAGNETIC RESONANCE IMAGING SYSTEM

CROSS-REFERENCE TO RELATED APPLICATION(S)

The present application claims priority under 35 U.S.C. § 119 to European Patent Application No. 23182279.2, filed Jun. 29, 2023, the entire contents of which is incorporated herein by reference.

FIELD

One or more example embodiments of the present invention relate to a method for operating a liquid helium cooling system of a magnetic resonance imaging system and a corresponding non-transitory computer-readable medium and magnetic resonance imaging system.

BACKGROUND

Independent of the grammatical term usage, individuals with male, female or other gender identities are included within the term.

Magnetic resonance imaging (MRI) scanners have a high energy consumption. For example, an energy consumption of a typical MRI scanner can be in the order of magnitude of about 70 MWh per year. One important factor is the energy needed for cooling the MRI scanner, in particular the magnet and coil of the scanner. In order to generate the magnetic fields needed for MRI scanning, the magnetic fields typically being in a range of up to 3 Tesla and even higher in some cases, superconductivity is need, which in turn requires correspondingly low temperatures. For this purpose, liquid helium cooling is applied, the temperature of liquid helium being at about 4 Kelvin. Due to the absorption of heat, the liquid helium will evaporate over time going into the gaseous phase. This effect of helium evaporation usually occurs to a significantly larger degree when the MRI scanner is actively used, i.e. during a scan, due to the heat that is created when operating the scanner. However, even when the scanner is not used, the helium will usually evaporate slowly over time. In order to counter this effect of helium evaporation, MRI scanners usually comprise a helium liquifying means or device such as a cold head. The liquifying device recondenses the helium that has evaporated back to the liquid state. Since helium requires a considerably larger amount of space when being in the gaseous phase then when being in the liquid phase (for about a factor of 750 under standard conditions), the system will typically have to vent some of the helium, if the amount of gaseous helium becomes too large. This is undesirable, since a resupply of additional helium is rather expensive and may requires additional maintenance breaks of the scanner. Furthermore, if too little Helium is in the liquid phase, the cooling power may no longer be sufficient, potentially leading to damage on the MRI system, for example, due to a quenching of the magnet coil. Hence, it is typically vital to ensure that the helium remains in the liquid phase.

On the other hand, the energy consumption mentioned above of such a cooling system can be a problem, in particular when regarding the application of renewable energies, such as photovoltaics and wind energy, which are not always available to the same degree.

SUMMARY

It is therefore an object of embodiments of the present invention to provide a mechanism and/or means to ensure more reliable operation of a magnetic resonance imaging system via its cooling system while at the same time reducing the energy consumption at least temporarily and/or adapting to the problem of renewable energy not being available to the same degree at any time.

At least this object is met or exceeded by a method, a non-transitory computer-readable medium, a computer program, and/or a magnetic resonance imaging system as claimed. Further features and advantages are described by the claims, the description and the attached figures.

According to a first aspect of embodiments of the present invention, a method for operating a liquid helium cooling system of a magnetic resonance imaging system, the liquid helium cooling system comprising a helium liquifying means or device, such as a cold head, is provided. The liquifying device has a standard operating mode that is adapted to allow performing a magnetic resonance scan without venting of substantial amounts of helium. The method comprises the following steps:

(a) providing a first timetable comprising scan times of the system and a second timetable comprising a plurality of time slots, each time slot being associated with one of at least two different levels of electrical power availability including one level of highest electrical power availability;

(b) determining off-times when the system is not used for scanning based on the first timetable;

(c) based on the second timetable, determining at least one time slot within the off-times that is not associated with the level of highest electrical power availability, wherein the at least one time slot is preferably associated with a level of lowest electrical power availability out of all time slots within the off-times;

(d) activating a power-saving mode during the determined at least one time slot, in which the liquifying device is supplied with a lower average amount of electrical power than during the standard operating mode;

(e) activating the standard operating mode of the liquifying device at the latest at a predefined time before the beginning of the next scan time such that the system is operable during the next scan time without the risk of venting a substantial amount of helium during or before the next scan time.

Advantageously, both, off-times and an electrical power availability, are considered when determining the at least one time slot in which the power-saving mode is activated. Accordingly, the method may be used to adapt the power usage not only according to the first timetable of scan times but also according to the availability of electrical power. For this purpose, two timetables may be used, the first timetable and the second timetable. In this context, a timetable may be understood such that times during which the MRI system is to be used and different availabilities of electric power are related to times, e.g. over the course of a day or, preferably, over the course of more than one day. The time slots of the second timetable may be very small, optionally infinitely small. Very small time slots may be used to represent a basically continuous change of electrical power availability. In this case, the power-saving mode may be activated during several time slots. On the other hand, at least some of the time slots may represent longer periods of time, such as one or several hours. Time slots representing larger amounts of time may, for example, be useful when the electrical power availability is constant or nearly constant over these longer periods of time, such as in the case of electric power price being set differently at different parts of the day or the solar cells producing relatively constant amounts of electric power during a particular period of time. The availability of electrical power may, for example, differ over the course of a day, of a week, or of a year. For example, the electrical power availability may be connected to a price of electrical power, such as the price being different at certain times at night or in the evening than at other times of the day. The electrical power availability may also be connected to the production of electrical power, such as solar cells producing more electrical power during periods of sunshine, or windmills being dependent on the intensity of wind. This method makes it possible to significantly reduce the energy consumption during the time, in which the power-saving mode is active. Accordingly, the method may advantageously be used to adapt to the problem of renewable energies not being available to the same degree at any time. For example, the power-saving mode may be active during a time at night when there is no sunshine and the standard operating mode may be activated after or at sunrise and before examinations with the MRI system are performed. Accordingly, if the system depends on renewable energies, due to this method, it may be feasible to reduce the number of batteries or other energy storage devices needed for operation during the night. For example, the operation of the MRI system for examinations may start about two to three hours after sunrise. Furthermore, the overall energy consumption may be reduced with the method according to embodiments of the present invention due to the power-saving mode requiring less energy.

By reactivating the standard operating mode at a predefined time before the beginning of the next scan time it can be ensured that a venting of helium does not occur before using the MRI system or when using the MRI system. Hence, the predefined time is defined such that the system is operable during the next scan time without the risk of venting a substantial amount of helium during or before the next MRI scan. The time in which the system operates in the standard operating mode may be seen as a recovery period, in which the magnet of the MRI system is cooled down to operating temperature and/or is prepared to be ready to be operable again.

According to an embodiment, the activation of the standard operating mode and the activation of the power-saving mode are timed such that the standard operating mode is running during a time slot associated with a higher level of electrical power availability than the time slot in which the power-saving mode is activated, preferably such that the standard operating mode is running during a time slot associated with the level of highest electrical power availability. Preferably, the level of electrical power availability is taken into account during step (c) of the method, i.e. when determining at least one time slot within the off-times that is not associated with the level of highest electrical power availability. The at least one time slot may be determined such that the activating of the standard operating mode takes place during a time slot of a higher electrical power availability, preferably the highest electrical power availability. Advantageously, the electrical power availability when the standard operating mode is activated at the predefined time may thus be taken into account. This may allow a more efficient use of energy, since this embodiment may ensure that enough and/or relatively inexpensive power is available for the standard operating mode.

Optionally, the predefined time before the beginning of the scan time may be adjusted depending on the next scheduled scan, in particular depending on an expected heat generation of the next scheduled scan. For example, the predefined time may be shortened, if less heat generation is expected.

A liquifying device is usually adapted to re-condense helium gas or helium vapor back to the liquid state. In particular, some of the helium may be in the gaseous phase after having cooled the MRI magnet. A typical liquifying means or device is a cold head that is known in the state of the art. A cold head may also sometimes be called or classified as cryocooler. The helium may be contained inside a cryostat. Typically, the superconductive wire material of the MRI coils may be immersed in a bath of the liquid helium. Accordingly, the power-saving mode may be a mode in which the liquifying device is operated at reduced power or in which the liquifying device is switched off. Hence, the power-saving mode may advantageously require a lower average amount of electrical power than the standard operating mode. The power-saving mode may be regarded as a controlled temporary disabling of the liquifying device or as a controlled operational reduction of the liquifying device. During the power-saving mode, the amount of gaseous helium may increase, in particular due to ambient heat. Hence, the power-saving mode may be configured not to be sufficient to keep (most of) the helium in the liquid phase over a long time, such as for a period of time of more than 5 hours. Hence, for example, the amount of gaseous helium may slowly increase during the power-saving mode. If the system would be operated at this time, the amount of gaseous helium might potentially become so large, that parts of the helium had to be vented. The amount of gaseous helium may than be reduced again in the standard operating mode such that at the time the MRI system is operated, the system is ready to be operated without helium having to be vented. The standard operating mode is in particular adapted to allow performing a magnetic resonance scan without venting of substantial amounts of helium. This may be understood such that the cooling power of the liquifying device during the standard operating mode is so strong, that enough gaseous helium can be brought into the liquid phase during a magnetic resonance scan to prevent the need of venting some of the helium. Hence, the standard operating mode is in particular configured such that over time the helium will be (mostly) kept in the liquid phase. In this context, "without venting substantial amounts of helium" may be understood such that very small amounts of helium may still be lost over time. The loss of small amounts of helium may be unavoidable, in particular due to the properties of helium such as helium atoms having a very small diameter. According to an embodiment, an amount of electrical power per time unit provided to the helium liquifying device during the power-saving mode is on average at least three times lower, preferably at least four times lower, than during the standard operating mode. The lower electrical power consumption may, for example, be achieved by switching the liquifying device off temporarily or even constantly during the power-saving mode. Alternatively, the lower electrical power consumption may be achieved by providing a constantly reduced amount of electrical power.

Advantageously, at least one time slot is determined that is not associated with the level of highest electrical power availability and the power-saving mode is activated during this at least one time slot. Preferably, the at least one time slot is chosen such that enough time is left for the standard operating mode to be activated at the latest at the predefined time before the beginning of the next scan time. Hence, preferably determining the at least one time slot may preferably be performed by already considering the time needed to activate the standard operating mode in step (e). For this purpose, in some situations, it may be advantageous not to choose the time slot with the lowest electrical power availability for the power-saving mode, since, in some situations, there may not be enough time afterwards to activate the standard mode in due time before the operation of the MRI system is scheduled. On the other hand, when it is possible, applying the power-saving mode, in a time slot with the lowest electrical power availability out of all time slots may be particularly advantageous.

According to an embodiment, the power-saving mode is a switch-off mode in which the liquifying device is switched off or an interleave mode in which the liquifying device is alternately switched on and off such that the switch-off times are at least three times longer than the switch-on times. The power-saving mode being a switch-off mode may advantageously allow to save a greater amount of energy during the power-saving mode. This may, in particular be beneficial if the power-saving mode can only be applied during a relatively short time slot. On the other hand, the interleave mode may in particular be advantageous, if a longer time-slot is available. Hence, the interleave mode may allow to have the power-saving mode active for a longer period of time before a venting of helium would occur or would be needed. Additionally and/or alternatively, the interleave mode may also be particularly advantageous, if the time after activating the standard operating mode and before starting the first scan of the MRI system is rather short. This may for example be the case, when scanning is supposed to start early in the day and a higher availability of electrical power starts only shortly before that, such as due to solar powered energy being available only after sunrise. In this case, the interleave mode may allow to reduce the amount of helium being in the gaseous phase at the time the standard operating mode is activated. Accordingly, in this particular case, compared to a complete switch-off, the recovery time may be shorter when using the interleave mode by the price of a lower energy saving. Advantageously, both the switch-off mode and the interleave mode may help to significantly reduce the energy consumption of the cooling system and, thus, of the magnetic resonance imaging system. It has been found that in the interleave mode, the switch-off times being at least three times longer than the switch-on times, may be a good ratio to efficiently save energy while having some advantages of the interleave mode. Accordingly, having a ratio of significantly more than three may lead to the interleave mode being closer to the switch-off mode in nature. The interleave mode may preferably be configured such that the switch-on times are in the order of magnitude of one or a few minutes, preferably 1 to 20 minutes, more preferably 2 to 8 minutes, and even more preferably 2 to 6 minutes. Correspondingly, the switch-off times may be in the order of magnitude of three times the switch on times or more, e.g., particularly preferred in the range of 6 to 18 minutes or more. It has been found that these amounts of time can be particularly advantageous to both ensure an efficient amount of energy saving and preventing a venting of helium for a particularly long time.

According to an embodiment, the liquifying device is switched off no longer than a predefined amount of time, wherein the predefined amount of time is defined such that a substantial venting of helium is avoided. The predefined amount of time may depend on the MRI system and/or its venting configuration. For example, the liquifying device may preferably be switched off for at most 4 hours, preferably at most 3 hours. During tests with a real MRI system, it has been found that, depending on the specific venting conditions of the particular system, the time till a venting occurs was in the time range of between 4 hours and 3 minutes and 5 hours and 21 minutes. The tests have been carried out, by keeping the MRI magnet in a stable configuration and then switching off the cold head. Then, the time until the magnet vented was measured. This time was defined to be when the relief valve opens and the magnet starts losing helium gas into the recovery line. Accordingly, based on the tests, a maximum amount of time of 4 hours may be feasible. A maximum amount of at most 3 hours may be more beneficial for providing a safety margin, therefore allowing, for example, for potential technical problems to occur without necessarily directly leading to a venting of helium. It has been found, for a commercially available MRI system, that about 12 kWh may be saved during one power-saving mode of 3 hours. This amounts to 4 kW per hour being saved by switching of the cold head and a helium compressor. The amount saved may likely vary for different systems.

According to an embodiment, the levels of electrical power availability are based on an expected price of electric power during the corresponding time slot and/or on an expected amount of electric power production during the corresponding time slot, the level of lowest electrical power availability being associated with a high expected price and/or a low expected amount of power production. The expected amount of electric power production may, for example, depend on the productivity of a renewable energy device, such as solar power cells or a wind turbine. For example, the power-saving mode may be activated towards the end of a night, e.g. 2 to 3 hours before sunrise, and the standard operating mode may be activated after sunrise and a sufficient time, e.g. 2 hours, before a planned start of scanning with the MRI system begins. The expected price may for example vary based on a user's electric power contract. For example, the user may have a contract, in which the energy during the night is cheaper than during the day. For example, the power-saving mode may be started towards the end of high-cost hours and the standard operating mode may be activated during low-cost hours.

According to an embodiment, the second timetable is updated dynamically based on received electrical power availability data. The electrical power availability data may comprise information, in particular predictions and/or estimates, about the availability of renewable energies and/or about energy prices. For example, the received electrical power availability data may comprise a weather forecast or data derived from a weather forecast. Additionally, and/or alternatively the electrical power availability data may comprise sunshine hours. The weather forecast may comprise information about an occurrence of clouds in the sky above solar panels. The weather forecast may comprise a prediction of a wind speed at the location of a wind turbine used for providing energy for the MRI system. Advantageously, a dynamic updating of the timetable may allow to adjust the timing of the power-saving mode to the actual current situation and/or the estimated situation in the near future.

According to an embodiment, the first timetable is updated dynamically based on a scheduling, in particular user-input scheduling, of magnetic resonance scans. Advantageously, the timing of the power-saving mode and the standard operating mode may thus be adapted dynamically, in particular by even taking into account changes on short notice. For example, the first timetable may be updated in the evening or at night based on the scheduling for the next day, and the power-saving mode and the standard operating mode for this night may be set according to the updated first timetable. For example, in case of a particularly early start of using the MRI system the next day, the power-saving mode may be shortened compared to other nights. In this case, the time during which the standard operating mode has to be activated before scanning can start may also be shorter due to the shorter time the power-saving mode was activated and hence the smaller amount of gaseous helium.

According to an embodiment, the predefined time before the beginning of the next scan time is between 0.5 and 5 hours, preferably between 1 and 4 hours, more preferably between 1.5 and 3 hours. A predefined time being in the range of 0.5 to 5 hours may be enough to make the system operable again. The time that is needed typically depends on the specific system, in particular the cooling system and the generation of heat during a scan. Hence, the predefined time may vary depending on the system. A predefined time in the range between 1 and 4 hours may be applicable for many typical systems. It has been found that a predefined time between 1.5 and 3 hours may be particularly advantageous at least for some commercially available systems, in particular 1.5 Tesla systems.

According to an embodiment, a partial power-saving mode is active during off-times that are neither operated in the power-saving mode nor in the standard operating mode, wherein, in the partial power-saving mode, the liquifying device is supplied with a lower average amount of electrical power than during the standard operating mode and with a higher average amount of electrical power than during the power-saving mode. Advantageously, the power-saving mode may allow to further save energy. In particular, the partial power-saving mode may be used always when no scan is scheduled and outside the timeslots the power-saving mode or the standard operating mode following the power-saving mode until the cooling system is recovered is activated. The partial power-saving mode can be a useful addition to the power-saving mode, for example in cases when there is no suitable time slot for the standard operating mode to recover the cooling system before the next scan. The partial power-saving mode is preferably configured such that the helium will not vent as long as the scanner is not operated. The partial power-saving mode may comprise switch-off times and switch-on times. For example, the power-saving mode may be configured corresponding to the interleave mode described herein with respect to the power-saving mode. For example, in the partial power-saving mode, the liquifying device may alternately be switched on and off such that the switch-off times are less than three times longer than the switch-on times. According to an embodiment, during the partial power-saving mode, the liquifying device is alternately switched on and off such that the switch-off times are at least as long as and at most 2.5 times longer than the switch-on times. It has been found that a partial power-saving mode with these relative times can, on the one hand, provide an effective way of saving power and, on the other hand, ensure that under normal conditions no substantial amount of helium is vented. For example, the switch-off times can be in the range of 5 to 12 minutes, preferably 6 to 10 minutes. Preferably, the partial power-saving mode comprises switch-off times are at least 1.5 times and at most 2.5 as long as the switch-on times. For example, the switch-off times may be twice as long as the switch-on times, such as the switch-off times being 8 minutes and the switch-on times being 4 minutes. Alternatively, the partial-saving mode may, for example, comprise operating the liquifying device at an essentially constant reduced power consumption.

A further aspect of embodiments of the present invention provides a non-transitory computer-readable medium storing a computer program that comprises instructions which, when the program is executed by a control unit of a magnetic resonance imaging system or of a liquid helium cooling system of a magnetic resonance imaging system cause the control unit to carry out the steps of the method as described herein. All features and advantages of the method may be adapted to the computer program and vice versa.

According to a further aspect of embodiments of the present invention, a magnetic resonance imaging system comprising a helium liquifying means or device such as a cold head, is provided. The liquifying device is configured to have a standard operating mode in which the liquifying device is supplied with an amount of electrical power that allows performing a magnetic resonance scan without venting a substantial amount of helium and a power-saving mode in which the liquifying device is supplied with a lower average amount of electrical power than during the standard operating mode. The system is configured to activate the power-saving mode during a time slot, in which there is no scheduled scan and in which an availability of electrical power is reduced, and activate the standard operating mode at the latest at a predefined time before the beginning of the next scheduled scan such that the system is operable during the next scan without the risk of venting a substantial amount of helium during or before the next scan time. The system may in particular be configured to carry out the method as described herein. All features and advantages of the method and of the computer program may be adapted to the magnetic resonance imaging system and vice versa. The system may comprise a control unit that is configured to control the liquifying device and activate the different modes of the liquifying device.

The embodiments described herein may be combined with each other unless indicated otherwise.

BRIEF DESCRIPTION OF THE DRAWINGS

The accompanying drawings illustrate various exemplary embodiments and methods of various aspects of the present invention.

DETAILED DESCRIPTION

Figure 1:
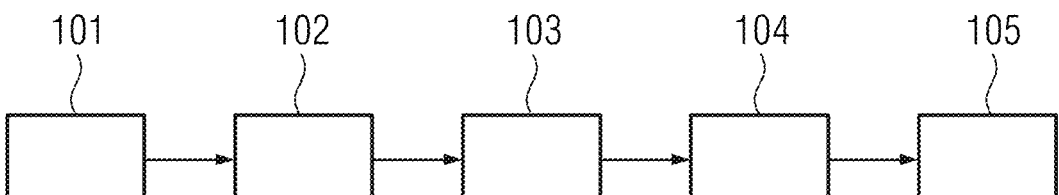
FIG. 1 shows a flow diagram of a method for operating a liquid helium cooling system of a magnetic resonance imaging system according to an embodiment of the present invention.

FIG. 1 shows a flow diagram of a method for operating a liquid helium cooling system of a magnetic resonance imaging system 11 according to an embodiment of the present invention. In a first step 101, a first timetable and a second timetable are provided. The first timetable comprises scan times of the magnetic resonance imaging system 11. The second timetable comprises a plurality of time slots 8 and each time slot 8 is associated with one of at least two different levels of electrical power availability. The levels of electrical power availability may be based on an expected price of electric power during the corresponding time slot 8. Additionally or alternatively the levels of electrical power availability may be based on an expected amount of electric power production during the corresponding time slot 8. The second timetable may be updated dynamically based on received electrical power availability data. Hence, for example, a current weather forecast may be used to update the second timetable by considering the weather forecast in order to determine an expected amount of electrical power production, e.g. as produced by wind turbines or solar panels. Updating the second timetable dynamically may provide a second timetable that predicts the actual electrical power availability of power production more accurately.

In a further step 102, based on the first timetable off-times are determined during which off-times the system is not used for scanning.

In a further step 103, based on the second timetable, at least one time slot 8, 81 within the off-times is determined that is not associated with the level of highest electrical power availability. If possible, the at least one time slot 81 is preferably associated with a level of lowest electrical power availability out of all time slots 8 within the off-times. The level of lowest electrical power availability may in particular be associated with a high expected price and/or a low expected amount of power production. Preferably the at least one time slot 8, 81 is further determined such that later, in step 105, the standard operating mode 5 is running during a time slot 8 associated with a higher level of electrical power availability than the time slot 8, 81 in which the power-saving mode 4 is activated in step 104.

In step 104, a power-saving mode 4 is activated during the determined at least one time slot 8, 81. In the power-saving mode 4, a liquifying device of the liquid cooling system, such as a cold head, is supplied with a lower average amount of electrical power than during a standard operating mode 5. The standard operating mode 5 is adapted to allow performing a magnetic resonance scan without venting of substantial amounts of helium. Preferably, an amount of electrical power per time unit provided to the helium liquifying device during the power-saving mode 4 is on average at least three times lower than during the standard operating mode 5. The power-saving mode 4 may be a mode in which the liquifying device is operated only in intervals or in which the liquifying device is completely switched off. The power-saving mode 4 may be configured not to be sufficient to keep the helium of the cooling system in the liquid phase over a long time. In particular, the amount of gaseous helium may slowly increase during the power-saving mode 4.

In a further step 105, before a scanning with the magnetic resonance imaging system 11 is started, the standard operating mode 5 of the liquifying device is activated. This happens at the latest at a predefined time before the beginning of the next scan time. The predefined time is defined such that the system is operable during the next scan time without the risk of venting a substantial amount of helium during or before the next MRI scan. Hence, the standard operating time is started early enough to enable a recovery of the cooling system and/or of the temperature of the magnet that is to be cooled by the cooling system. For example, the predefined time before the beginning of the next scan time is between 1.5 and 3 hours, e.g. 2 hours, before the next scan time. Preferably, the standard operating mode 5 is started such that the standard operating mode 5 is running during a time slot 8 associated with the level of highest electrical power availability. In order to achieve this, in the previous step 103 the at least one time slot 8, 81 is preferably determined accordingly, to ensure that the power-saving mode 4 ends right when the time slot 8 with the level of highest electrical power availability starts.

Figure 2:
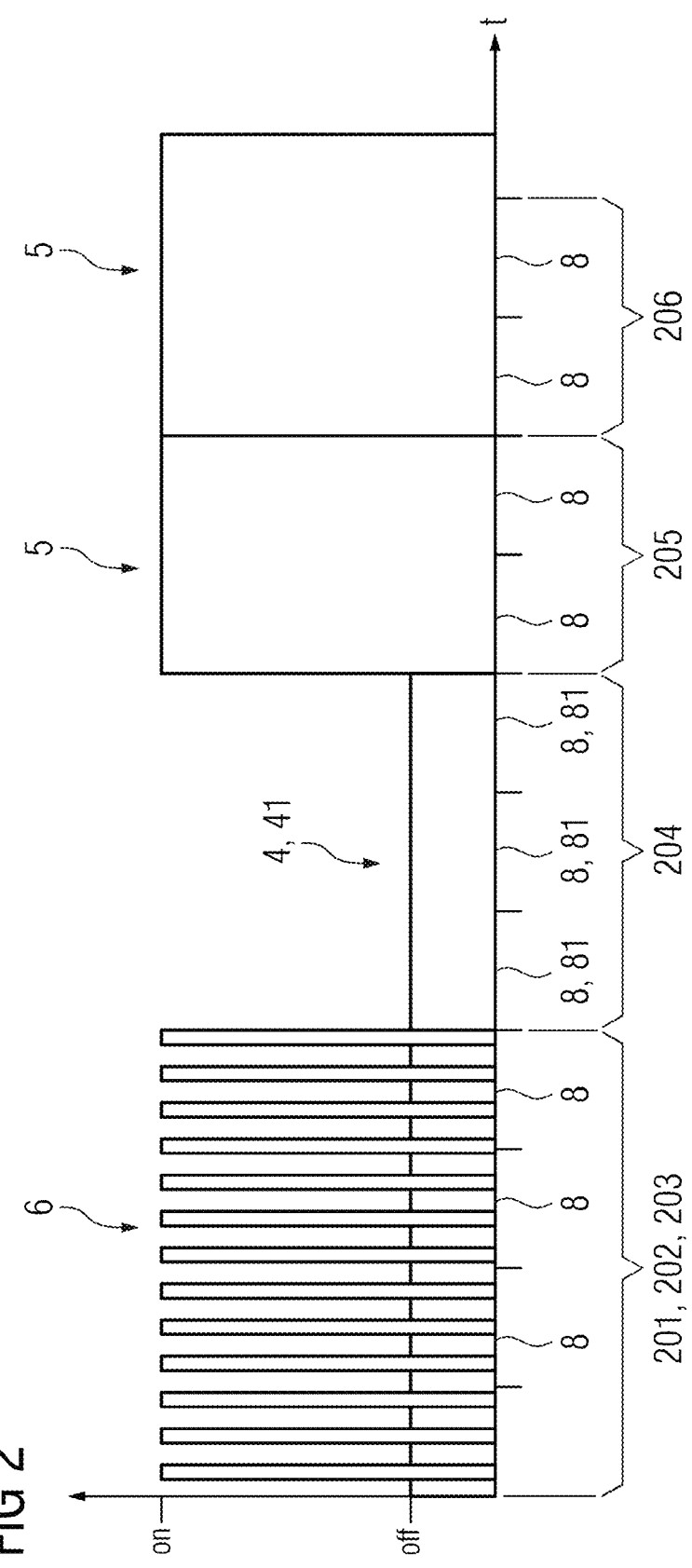
FIG. 2 shows a diagram of electrical power fed to a liquifying device of a helium cooling system of a magnetic resonance imaging system over time while a method according to an embodiment of the present invention is applied.

FIG. 2 shows a diagram of the electrical power fed to the liquifying device of a helium cooling system of a magnetic resonance imaging system 11 over time while a method according to an embodiment of the present invention is applied. In this embodiment the electrical power is either on, e.g. on maximum power setting, or off. At first the liquifying device is operated in a partial power-saving mode 6. This may for example be during the earlier hours of the night. In the partial power-saving mode 6, the power of the liquifying device is on and off alternatingly. In this example, the switch-off times are about 1.5 times as long as the switch-on times. However, optionally, another ratio may be applied. Optionally, the liquifying may instead be operated in a standard operating mode 5 at least temporarily. During this time or before this time, the first steps 201-203 of the method according to an embodiment of the present invention are performed. Namely, in a first step 201, a first timetable comprising scan times of the magnetic resonance imaging system 11 and a second timetable comprising a plurality of time slots 8 is provided. Each time slot 8 is associated with one of at least two different levels of electrical power availability. While the time slots 8 are drawn with about equal spacing in this example, the time slots 8 may also be of different spacing depending on the time development of the electrical power availability. A further step 202 comprises determining off-times when the system is not used for scanning based on the first timetable. A further step 203 comprises determining at least one time slot 81 within the off-times that is not associated with the level of highest electrical power availability based on the second timetable. This may for example be in the later hours of the night. In this example the at least one time slot 81 comprises three time slots 81. When the first of the determined time slots 81 starts, the power-saving mode 4 is activated by switching off the power of the liquifying device, step 204. Thus, the power-saving mode 4 is a switch-off mode 41 in which the cooling system is not active. The liquifying device is switched off no longer than a predefined amount of time that is defined such that a substantial venting of helium is avoided. For example, the liquifying device may be switched off for at most 3 hours. In this example, this corresponds to the three chosen time slots 81. For example, in the partial power-saving mode 6, the cooling system may consume on average around 4 kW. Accordingly, in this example, 12 kWh can be saved during the power-saving mode 4. After the power-saving mode 4 ends at the end of the last corresponding time slot 81, the standard operating mode 5 is activated, step 205. The activation of the standard operating mode 5 and the activation of the power-saving 4 mode are timed such that the standard operating mode 5 is running during a time slot 8 associated with a higher level of electrical power availability than the time slot 81 in which the power-saving mode 4 is activated. During this step of recovery 205, the helium cooling system recovers until it is ready in step 206 to operate the scanner of the magnetic resonance imaging system 11 without venting helium. During the scan, the standard operating mode 5 is also active.

Figure 3:
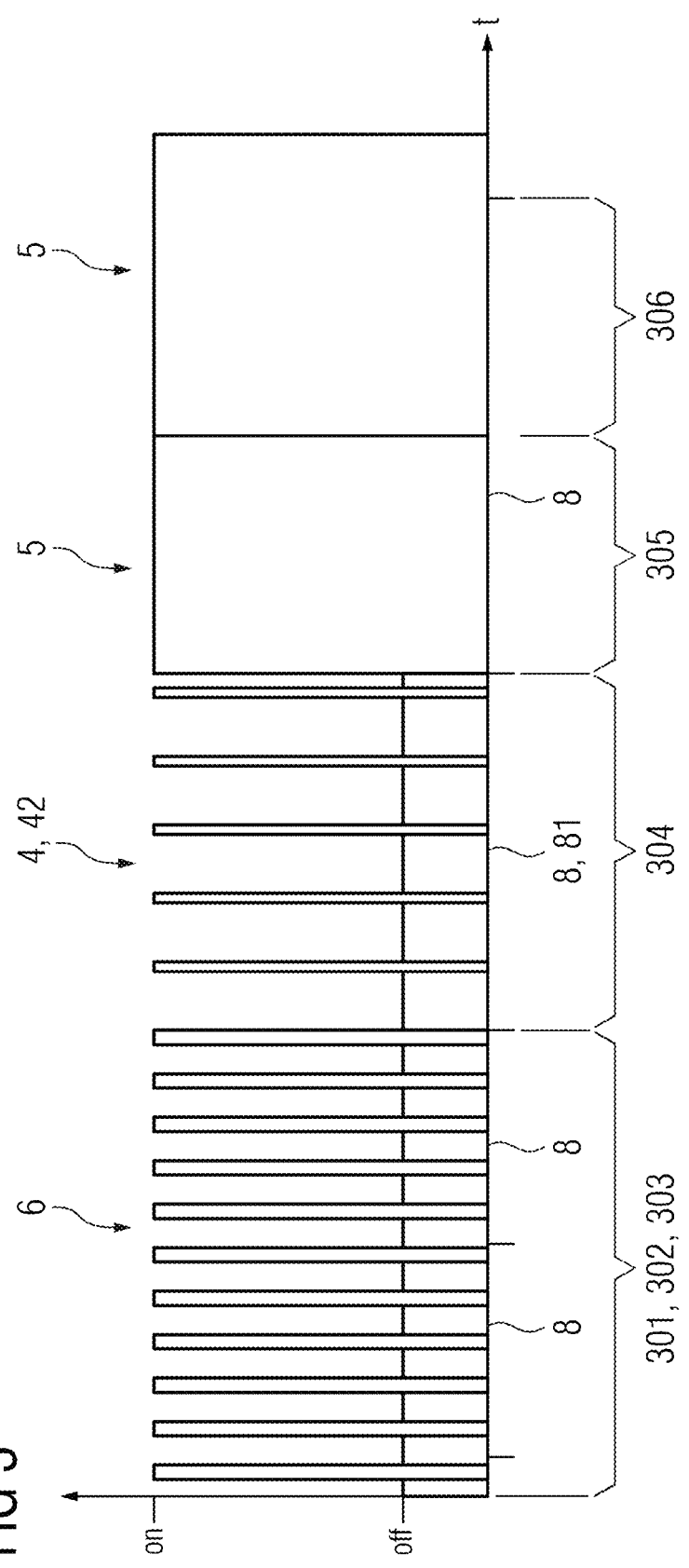
FIG. 3 shows shows a diagram of the electrical power fed to the liquifying device of a helium cooling system of a magnetic resonance imaging system over time while a method according to another embodiment of the present invention is applied.

FIG. 3 shows a diagram of the electrical power fed to the liquifying device of a helium cooling system of a magnetic resonance imaging system 11 over time while a method according to another embodiment of the present invention is applied. In this embodiment the electrical power is either on, e.g. on maximum power setting, or off. At first the liquifying device is operated in a partial power-saving mode 6. In the partial power-saving mode 6, the power of the liquifying device is on and off alternatingly. In this example, the switch-off times are about 2 times as long as the switch-on times. However, optionally, another ratio may be applied. During this time or before this time, the first steps 301-303 of the method according to an embodiment of the present invention are performed. These steps 301-303 may, for example, be carried out analogously as described with respect to the embodiment shown in FIG. 2. In this example one time slot 81 is determined for the power-saving mode 4. When the determined time slots 81 starts, the power-saving mode 4 is activated, step 304. The power-saving mode 4 is an interleave mode 42 in which the liquifying device is alternately switched on and off. In this example, the switch-off times are about 4.5 times longer than the switch-on times. The power-saving mode 4 last no longer than a predefined amount of time that is defined such that a substantial venting of helium is avoided. The electrical power availability may be relatively constant in this time slot 81. E.g. the time slot 81 may be associated with the lowest electrical power availability, such as during the night when electrical power is obtained from solar panels. After the power-saving mode 4 ends, here at the end of the corresponding time slot 81, the standard operating mode 5 is activated, step 305. The activation of the standard operating mode 5 and the activation of the power-saving 4 mode are timed such that the standard operating mode 5 is running during a time slot 8 associated with a higher level of electrical power availability than the time slot 81 in which the power-saving mode 4 is activated. During this step of recovery 305, the helium cooling system recovers until it is ready in step 306 to operate the scanner of the magnetic resonance imaging system 11 without venting helium. During the scan, the standard operating mode 5 is also active.

Figure 4:
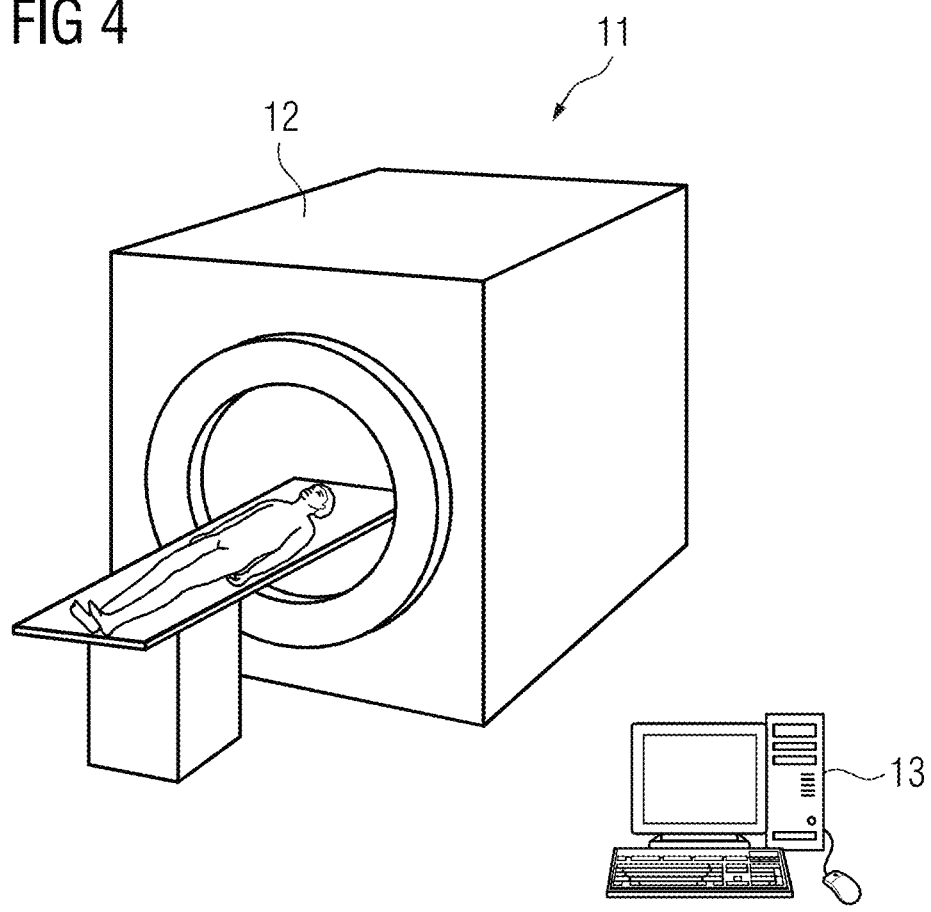
FIG. 4 shows a magnetic resonance imaging system according to an embodiment of the present invention.

FIG. 4 shows a magnetic resonance imaging system 11 according to an embodiment of the present invention. The magnetic resonance imaging system 11 comprises a liquifying means or device (not shown) that is at least partially inside a gantry 12. The liquifying device is configured to have a standard operating mode 5 in which the liquifying device is supplied with an amount of electrical power that allows performing a magnetic resonance scan without venting a substantial amount of helium and a power-saving mode 4 in which the liquifying device is supplied with a lower average amount of electrical power than during the standard operating mode 5. The magnetic resonance imaging system 11 comprises a control unit 13 and is configured to, via the control unit 13, activate the power-saving mode 4 during a time slot 8, 81, in which there is no scheduled scan and in which an availability of electrical power is reduced, and activate the standard operating mode 5 at the latest at a predefined time before the beginning of the next scheduled scan such that the system is operable during the next scan without the risk of venting a substantial amount of helium during or before the next scan time.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "on," "connected," "engaged," "interfaced," and "coupled." Unless explicitly described as being "direct," when a relationship between first and second elements is described in the disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" on, connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

It is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed above. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments. The present invention may, however, be embodied in many alternate forms and should not be construed as limited to only the embodiments set forth herein.

In addition, or alternative, to that discussed above, units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion.

In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one example embodiment relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Bluray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Although the present invention has been shown and described with respect to certain example embodiments, equivalents and modifications will occur to others skilled in the art upon the reading and understanding of the specification. The present invention includes all such equivalents and modifications and is limited only by the scope of the appended claims.

What is claimed is:

1. A method for operating a liquid helium cooling system of a magnetic resonance imaging system, the liquid helium cooling system including a helium liquifying device configured to operate in a standard operating mode to allow performing a magnetic resonance scan without venting of substantial amounts of helium, the method comprising:

providing a first timetable and a second timetable, the first timetable including scan times of the magnetic resonance imaging system and the second timetable including a plurality of time slots, each time slot being associated with one of at least two different levels of electrical power availability, the at least two different levels including one level of highest electrical power availability;

determining, based on the first timetable, off-times when the magnetic resonance imaging system is not used for scanning;

determining, based on the second timetable, at least one time slot within the off-times that is not associated with the level of highest electrical power availability, wherein the at least one time slot is associated with a level of lowest electrical power availability among time slots within the off-times;

activating a power-saving mode during the at least one time slot, wherein in the power-saving mode the helium liquifying device is supplied with a lower average amount of electrical power than in the standard operating mode; and activating the standard operating mode of the helium liquifying device prior to a start of a next scan time such that the magnetic resonance imaging system is operable during the next scan time without risk of venting a substantial amount of helium during or before the next scan time.

2. The method according to claim 1, wherein an amount of electrical power per time unit provided to the helium liquifying device in the power-saving mode is, on average, at least three times lower than in the standard operating mode.

3. The method according to claim 1, wherein activation of the standard operating mode and activation of the power-saving mode are timed such that the standard operating mode is running during a time slot associated with a higher level of electrical power availability than a time slot in which the power-saving mode is activated.

4. The method according to claim 1, wherein the power-saving mode is a switch-off mode in which the helium liquifying device is switched off, or an interleave mode in which the helium liquifying device is alternately switched on and off such that switch-off times are at least three times longer than switch-on times.

5. The method according to claim 4, wherein the helium liquifying device is switched off no longer than an amount of time needed to avoid a substantial venting of helium.

6. The method according to claim 4, wherein the helium liquifying device is switched off for less than or equal to 4 hours.

7. The method according to claim 1, wherein levels of electrical power availability are based on at least one of an expected price of electrical power during a corresponding time slot or an expected amount of electrical power production during the corresponding time slot, wherein the level of lowest electrical power availability is associated with at least one of a high expected price or a low expected amount of power production.

8. The method according to claim 1, further comprising:

dynamically updating the second timetable based on received electrical power availability data.

9. The method according to claim 8, wherein the received electrical power availability data includes a weather forecast or data derived from a weather forecast.

10. The method according to claim 1, further comprising:

dynamically updating the first timetable based on a scheduling of magnetic resonance scans.

11. The method according to claim 1, wherein the activating activates the standard operating mode of the helium liquifying device between 0.5 and 5 hours prior to the start of the next scan time.

12. The method according to claim 1, wherein a partial power-saving mode is active during off-times during which neither the power-saving mode nor the standard operating mode is activated, and in the partial power-saving mode, the helium liquifying device is supplied with a lower average amount of electrical power than in the standard operating mode and with a higher average amount of electrical power than in the power-saving mode.

13. The method according to claim 12, wherein, during the partial power-saving mode, the helium liquifying device is alternately switched on and off such that switch-off times are greater than or equal to switch-on times and at most 2.5 times longer than the switch-on times.

14. A non-transitory computer-readable medium storing a computer program including instructions that, when executed by a control unit of a magnetic resonance imaging system or of a liquid helium cooling system of a magnetic resonance imaging system, cause the control unit to perform the method according to claim 1.

15. A magnetic resonance imaging system comprising:

a helium liquifying device configured to operate in a standard operating mode and a power-saving mode;

wherein, in the standard operating mode, the helium liquifying device is supplied with an amount of electrical power that allows performing of a magnetic resonance scan without venting a substantial amount of helium;

wherein, in the power-saving mode, the helium liquifying device is supplied with a lower average amount of electrical power than in the standard operating mode; and wherein the magnetic resonance imaging system is configured to activate the power-saving mode during a time slot in which there is no scheduled scan and in which an availability of electrical power is reduced, activate the standard operating mode prior to start of a next scheduled scan such that the magnetic resonance imaging system is operable during the next scheduled scan without risk of venting a substantial amount of helium during or before the next scheduled scan, and perform the method according to claim 1.

16. The method according to claim 1, wherein the helium liquifying device is a cold head.

17. The method according to claim 2, wherein the amount of electrical power per time unit provided to the helium liquifying device in the power-saving mode is, on average, at least four times lower than in the standard operating mode.

18. The method according to claim 1, wherein activation of the standard operating mode and activation of the power-saving mode are timed such that the standard operating mode is running during a time slot associated with the level of highest electrical power availability.

19. The method according to claim 4, wherein the helium liquifying device is switched off for less than or equal to 3 hours.

20. The method according to claim 1, wherein the activating activates the standard operating mode of the helium liquifying device between 1 and 4 hours prior to the start of the next scan time.

21. The method according to claim 1, wherein the activating activates the standard operating mode of the helium liquifying device between 1.5 and 3 hours prior to the start of the next scan time.

22. The magnetic resonance imaging system according to claim 15, wherein the helium liquifying device is a cold head.

23. A magnetic resonance imaging system comprising:

a helium liquifying device configured to operate in a standard operating mode and a power-saving mode;

wherein, in the standard operating mode, the helium liquifying device is supplied with an amount of electrical power that allows performing of a magnetic resonance scan without venting a substantial amount of helium;

wherein, in the power-saving mode, the helium liquifying device is supplied with a lower average amount of electrical power than during the standard operating mode; and wherein the magnetic resonance imaging system is configured to activate the power-saving mode during a time slot in which there is no scheduled scan and in which an availability of electrical power is reduced, and activate the standard operating mode prior to start of a next scheduled scan such that the magnetic resonance imaging system is operable during the next scheduled scan without risk of venting a substantial amount of helium during or before the next scheduled scan.

* * * * *